(12) United States Patent
Suzuki et al.

(10) Patent No.: US 7,619,494 B2
(45) Date of Patent: Nov. 17, 2009

(54) LADDER TYPE PIEZOELECTRIC FILTER

(75) Inventors: Kenji Suzuki, Nagoya (JP); Kazuyuki Mizuno, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/029,738

(22) Filed: Feb. 12, 2008

(65) Prior Publication Data

US 2008/0197941 A1    Aug. 21, 2008

(30) Foreign Application Priority Data

Feb. 21, 2007    (JP) .............................. 2007-041167

(51) Int. Cl.
*H03H 9/54* (2006.01)
*H03H 9/205* (2006.01)
(52) U.S. Cl. ...................... 333/189; 333/133
(58) Field of Classification Search ................ 333/187, 333/188, 189, 190, 193, 133
See application file for complete search history.

(56) References Cited

U.S. PATENT DOCUMENTS 6,262,637 B1 *    7/2001    Bradley et al. ............... 333/133

7,554,422 B2 *    6/2009    Nakatsuka et al. ........... 333/133

FOREIGN PATENT DOCUMENTS

JP    2001-024476 A1    1/2001

* cited by examiner

*Primary Examiner*—Dean O Takaoka
(74) *Attorney, Agent, or Firm*—Burr & Brown

(57) ABSTRACT

In a ladder-type piezoelectric filter, the attenuation in the stop bands on a low frequency side and a high frequency side are increased while the pass band is widened. The ladder-type piezoelectric filter is made up by alternately connecting parallel arms and series arms. The parallel arms are respectively made up by serially connecting parallel resonators and LC element networks, and the series arms are respectively made up of series resonators. The LC element networks are respectively made up so as to be inductive in resonant frequencies of the serially connected parallel resonators. Further, the LC element networks include capacitors which contribute to formation of a new series resonant point in the stop band on the high frequency side.

3 Claims, 8 Drawing Sheets

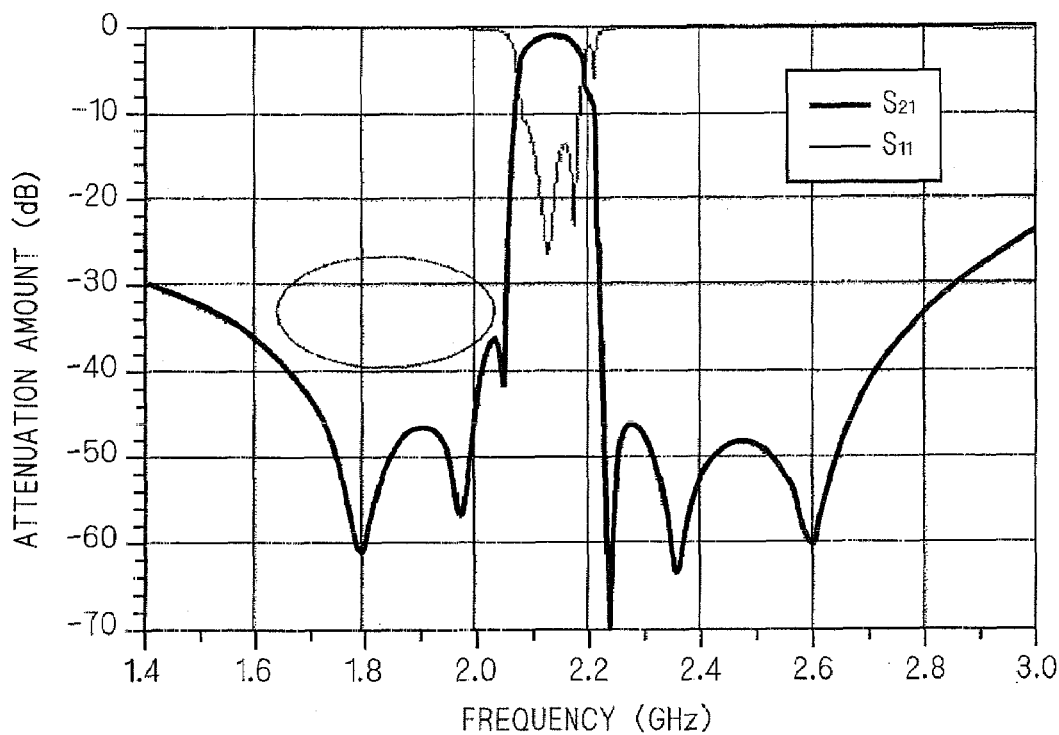
F I G . 7
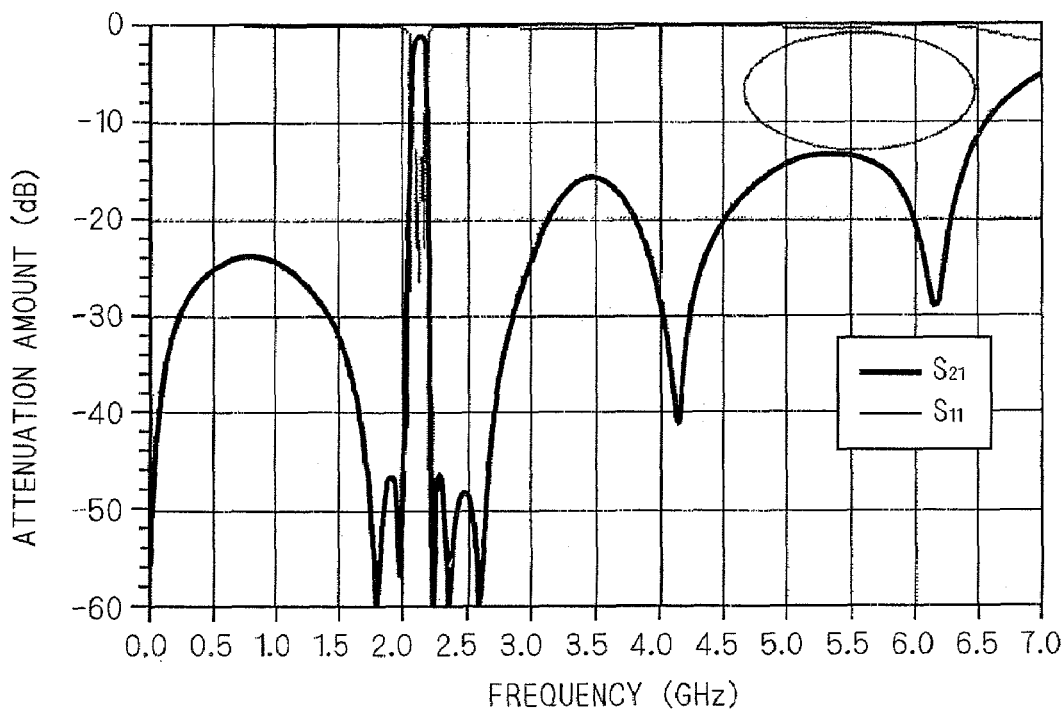
F I G . 8

F I G. 1 1
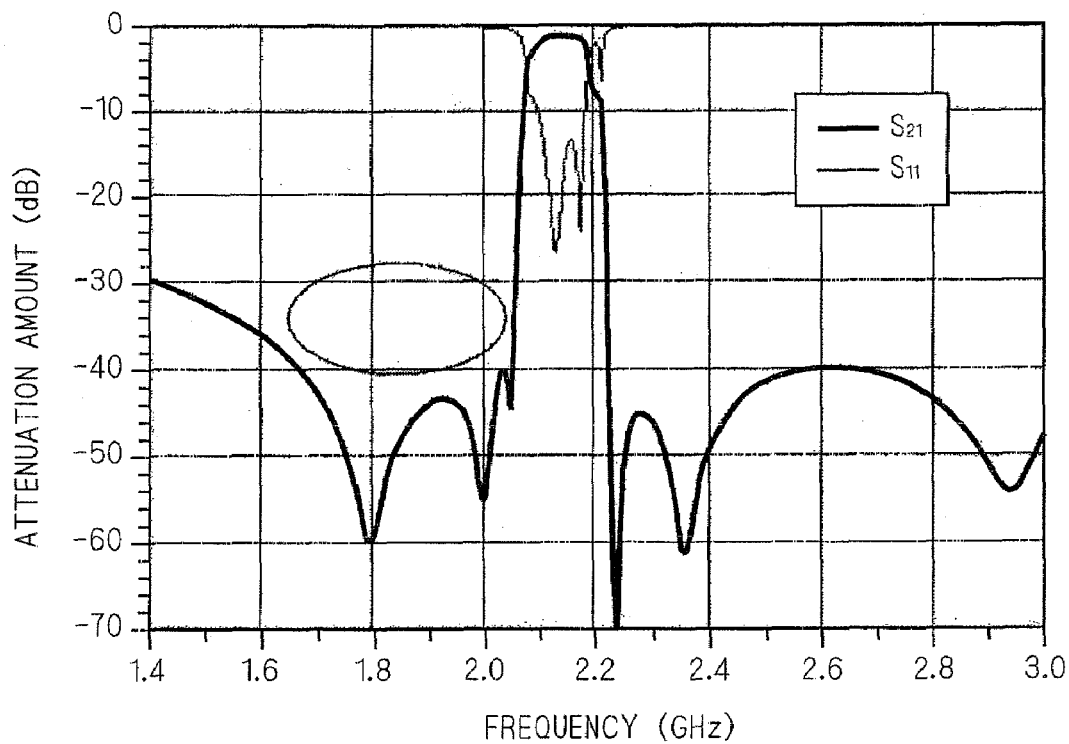
F I G. 1 2
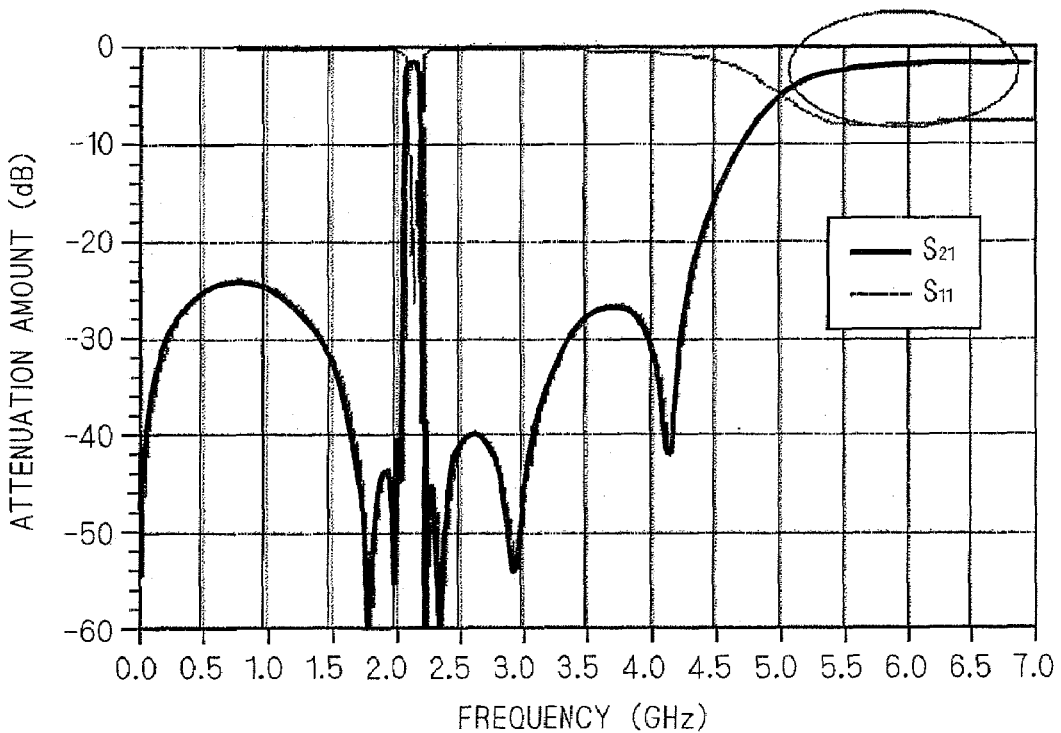

LADDER TYPE PIEZOELECTRIC FILTER

BACKGROUND OF THE INVENTION

1. Field of the Invention

The present invention relates to a ladder-type piezoelectric filter.

2. Description of the Background Art

FIG. 13 is a circuit diagram of a conventional ladder-type piezoelectric filter 8. As shown in FIG. 13, the ladder-type piezoelectric filter 8 is made up by alternately connecting parallel arms 81, 83, 85 and series arms 82, 84. The parallel arms 81, 83, 85 are respectively made up of parallel resonators 811, 831, 851, and the series arms 82, 84 are respectively made up of series resonators 821, 841. In the ladder-type piezoelectric filter 8, antiresonant frequencies of the parallel resonators 811, 831, 851 are substantially matched with resonant frequencies of the series resonators 821, 841, so as to obtain a band pass characteristic.

However, a pass band width of the ladder-type piezoelectric filter 8 depends upon the difference between the resonant frequency and antiresonance frequency of the parallel resonators 811, 831, 851 and the series resonators 821, 841, namely electromechanical coupling coefficients of piezoelectric material used in the parallel resonators 811, 831, 851 and the series resonators 821, 841. For this reason, in the ladder-type piezoelectric filter 8, it may be difficult to assure a desired pass band width. Further, in the ladder-type piezoelectric filter 8, the attenuation of a stop band on a low frequency side or a high frequency side may not be sufficiently assured.

In order to solve these problems, a ladder-type piezoelectric filter 9 shown in a circuit diagram of FIG. 14 has also hitherto been used (see for example, Japanese Patent Application Laid-Open No. 2001-24476). The ladder-type piezoelectric filter 9 is made up by alternately connecting parallel arms 91, 93, 95 and series arms 92, 94. The parallel arms 91, 93, 95 are respectively made up by serially connecting parallel resonators 911, 931, 951 and inductors 912, 932, 952, and the series arms 92, 94 are respectively made up of series resonators 921, 941. The inductors 912, 932, 952 serve to lower resonant frequencies of the parallel resonators 911, 931, 951 so as to widen a pass band width of the ladder-type piezoelectric filter 9. Further, in the ladder-type piezoelectric filter 9, inductances of the inductors 912, 932, 952 are adjusted to make the resonant frequencies of the parallel resonators 911, 931, 951 slightly different from one another, thereby allowing an increase in the attenuation of the stop band on the low frequency side.

However, the ladder-type piezoelectric filter including the parallel arms made up by serially connecting the parallel resonators and the inductors has the problem of not being able to sufficiently assure the attenuation of the stop band in a high frequency side.

SUMMARY OF THE INVENTION

The present invention relates to a ladder-type piezoelectric filter.

According to the present invention, there is provided a ladder-type piezoelectric filter including: parallel arms which include parallel resonators; and series arms which include series resonators, wherein in all or part of said parallel arms, an element network including a capacitive element which is inductive in a resonant frequency of said parallel resonator and contributes to formation of a new series resonant point in a stop band on a high frequency side, is serially connected to said parallel resonator.

It is thereby possible in the ladder-type piezoelectric filter to increase attenuation in stop bands on a low frequency side and a high frequency side while widening a pass band.

Accordingly, an object of the present invention is to increase, in the ladder-type piezoelectric filter, the attenuation in the stop bands on the low frequency side and the high frequency side while widening the pass band.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7 and 8 are views each showing a filtering characteristic of the ladder-type piezoelectric filter of Example;

FIGS. 11 and 12 are views each showing a filtering characteristic of the ladder-type piezoelectric filter of Comparative Example 2.

DETAILED DESCRIPTION OF THE INVENTION (Electrical Configuration of Ladder-Type Piezoelectric Filter)

In the following, a ladder-type piezoelectric filter according to a preferred embodiment of the present invention is described as an example of a bulk acoustic wave (BAW) filter formed by combining five film bulk acoustic resonators (FBARs). However, the number of FBARs constituting the BAW filter is not restricted to five, but may be not larger than four or not smaller than six. Further, although the BAW filter is more advantageous than a surface acoustic wave (SAW) filter in that it has a steep attenuation characteristic and a higher withstanding power while still being configured in a small size, this however, does not prevent application of the present invention to the SAW filter.

Figure 1:
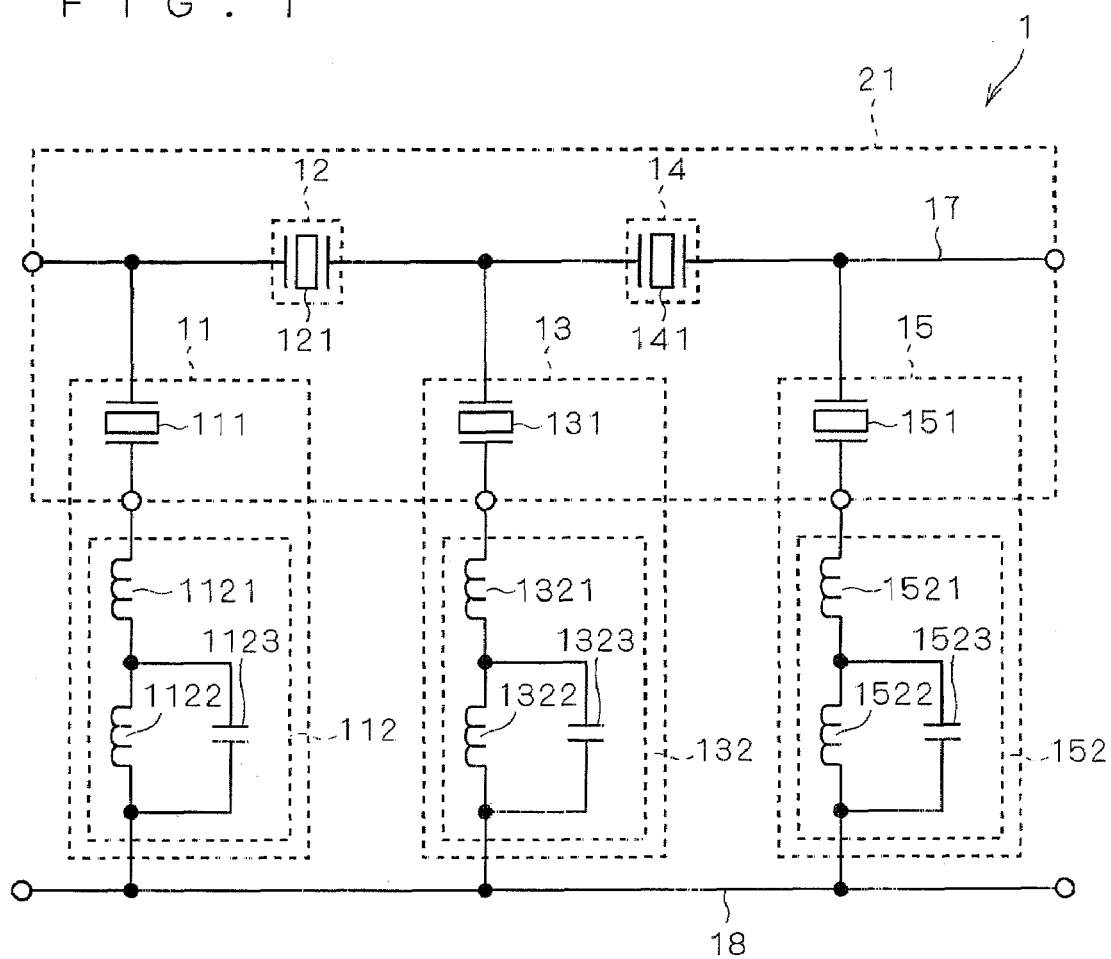
FIG. 1 is a circuit diagram of a ladder-type piezoelectric filter according to a preferred embodiment of the present invention.

FIG. 1 is a circuit view of a ladder-type piezoelectric filter 1 according to the preferred embodiment of the present invention.

As shown in FIG. 1, the ladder-type piezoelectric filter 1 is made up by alternately connecting parallel arms 11, 13, 15 which crosslink a signal line 17 and a ground line 18, and series arms 12, 14 which are inserted in the signal line 17. The parallel arms 11, 13, 15 are respectively made up by serially connecting parallel resonators 111, 131, 151 and LC element networks 112, 132, 152, and the series arms 12, 14 are respectively made up of series resonators 121, 141. It is to be noted that an LC element network is not necessarily provided in each of the parallel arms 11, 13, 15 as shown in FIG. 1, but may be provided in part of the parallel arms 11, 13, 15. Further, the series arms 12, 14 are not necessarily configured of the series resonators 121, 141 alone, but may be made up by serially connecting the series resonators 121, 141 and inductors or the like.

Generally speaking, the ladder-type piezoelectric filter is categorized into: a T-type which includes odd-numbered resonators, that starts with a series arm and ends with a series arm; and a π-type which includes odd-numbered resonators, that starts with a parallel arm and ends with a parallel arm. The π-type has been adopted to the ladder-type piezoelectric filter 1. The reason for adoption of the π-type to the ladder-type piezoelectric filter 1 is that the number of parallel arms can be increased further in the π-type than in the T-type, thereby allowing an efficient increase in the attenuation in both the stop bands on the low frequency side and the high frequency side. However, it is also possible to apply the present invention to the T-type ladder-type piezoelectric filter. Further, it is also possible to apply the present invention to both a ladder-type piezoelectric filter which includes even-numbered resonators, that starts with a series arm and ends with a parallel arm, and a ladder-type piezoelectric filter which includes even-numbered resonators, that starts with a parallel arm and ends with a series arm.

The LC element networks 112, 132, 152 are configured so as to be inductive respectively in the vicinity of resonant frequencies of the parallel resonators 111, 131, 151. Thereby, as do the inductors 912, 932, 952 shown in FIG. 14, the LC element networks 112, 132, 152 serve to lower the resonant frequencies of the parallel resonators 111, 131, 151 so as to widen a pass band width of the ladder-type piezoelectric filter 1. Further, in the ladder-type piezoelectric filter 1, the reactance components of the LC element networks 112, 132, 152 in the resonant frequencies of the serially connected parallel resonators 111, 131, 151 are adjusted to make the resonant frequencies of the parallel resonators 111, 131, 151 slightly different, thereby allowing an increase in attenuation in the stop bands on the low frequency side and the high frequency side.

Further, the LC element networks 112, 132, 152 are configured so as to increase series resonant points of the parallel arms 11, 13, 15 inside the stop band on the high frequency side. The "series resonant point" means a frequency at which a reactance component of an impedance is 0 and the impedance is minimal. As the conventional ladder-type piezoelectric filter 9 shown in FIG. 14, in a case of serially connecting only the inductors 912, 932, 952 to the parallel resonators 911, 931, 952, only one series resonant point can be formed within the stop band on the high frequency side. However, as in the ladder-type piezoelectric filter 1 shown in FIG. 1, in a case of serially connecting the LC element networks 112, 132, 152, which include capacitors 1123, 1323, 1523 to contribute to formation of a new serial resonant point, to the parallel resonators 111, 131, 151, two series resonant points can be formed in the stop band on the high frequency side, whereby it is possible to form a new attenuation pole within the stop band on the high frequency side, so as to increase attenuation in the stop band on the high frequency side.

It is to be noted that in a case where the ladder-type piezoelectric filter 1 has a plurality of parallel arms 11, 13, 15, new series resonant points, formed by contribution of the capacitors 1123, 1323, 1523 respectively in the parallel arms 11, 13, 15, may be made different. This allows formation of a plurality of new attenuation poles within the stop band on the high frequency side, thereby increasing attenuation over a broad frequency.

The LC element networks 112, 132, 152 are made up by combining inductors and capacitors so as to satisfy the foregoing requirement. For example, as shown in FIG. 1, the LC element network 112 can be configured such that, after serial connection of an inductor 1121 and an inductor 1122 and parallel connection of the inductor 1122 and the capacitor 1123, inductances of the inductors 1121, 1122 and a capacitance of the capacitor 1123 are determined so as to satisfy the foregoing requirement. The LC element network 132 can also be made up by combining inductors 1321, 1322 and the capacitor 1323 in the same manner as the LC element network 112, and the LC element network 152 can also be made up by combining inductors 1521, 1522 and the capacitor 1523 in the same manner as the LC element network 112

It is to be noted that LC element networks 112, 132, 152 shown in FIG. 1 increases the number of series resonant points of the parallel arms 11, 13, 15 by two, as compared with a case of providing neither inductors nor the LC element networks 112, 132, 152. However, the number of inductors or capacitors constituting the LC element networks 112, 132, 152 may be increased, to increase the number of series resonant points of the parallel arms 11, 13, 15 by not smaller than three. Further, the LC element networks 112, 132, 152 are not necessarily made up of lumped parameter elements, but may be made up by mixing of distributed parameter elements. Moreover, it is not required that the inductors 1121, 1122, 1321, 1322, 1521, 1522 be purely inductive and the capacitors 1122, 1321, 1322, 1522 be purely capacitive, namely, the LC element networks 112, 132, 152 be complete two-terminal reactance circuits, and the LC element networks 112, 132, 152 may have resistance components to some degree.

(Structure of Ladder Type Piezoelectric Filter)

Figure 2:
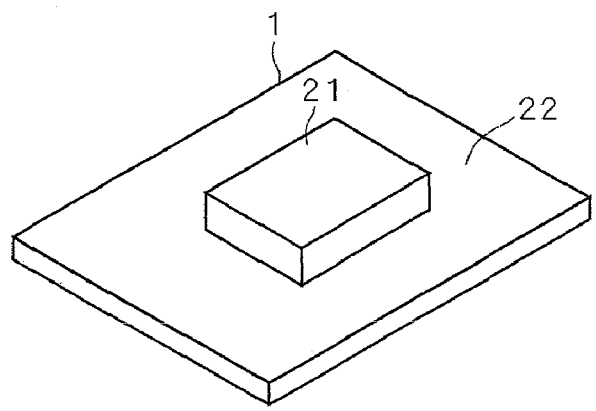
FIG. 2 is an oblique view of the ladder-type piezoelectric filter according to the preferred embodiment of the present invention.

FIG. 2 is an oblique view schematically showing a structure of the ladder-type piezoelectric filter 1.

As shown in FIG. 2, the ladder-type piezoelectric filter 1 is made up by flip-flop mounting a bear chip 21 on the surface of a substrate 22. In the ladder-type piezoelectric filter 1, the parallel resonators 111, 131, 151 and the series resonators 121, 141 are formed on the bear chip 21 side, and the LC element networks 112, 132, 152 are formed on the substrate 22 side. Naturally, part or all of the LC element networks 112, 132, 152 are formed on the bear chip 21 side.

Figure 3:
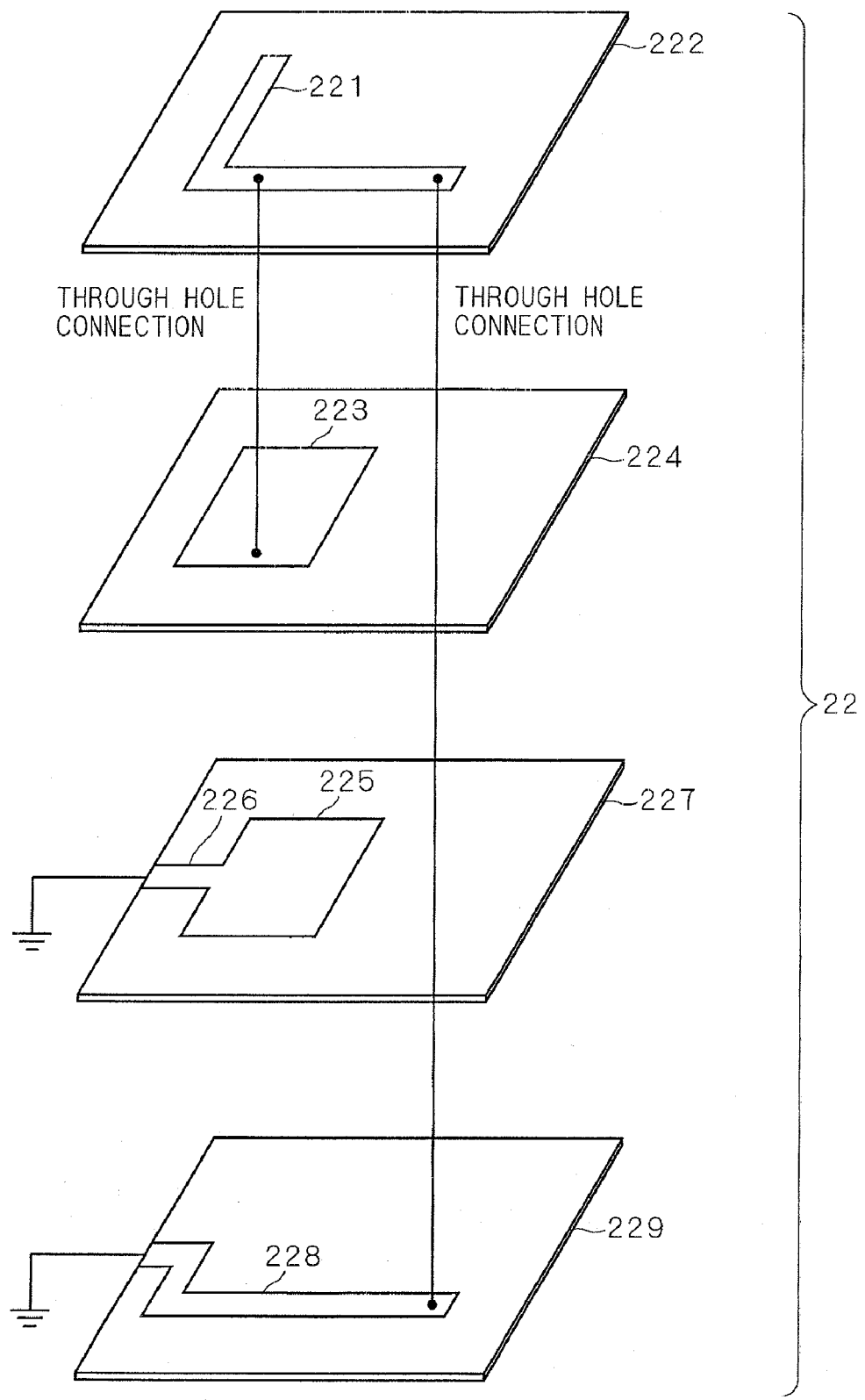
FIG. 3 is an exploded oblique view showing a laminated structure of a substrate.

As shown in FIG. 3, the substrate 22 is a multilayered substrate formed by laminating dielectric layers on which patterns of thick film electrodes have been printed. FIG. 3 is an exploded oblique view showing a laminated structure of the substrate 22 with attention focused on a portion where the LC element network 112 (132, 152) has been formed. The substrate 22 has a laminated structure formed by laminating: a dielectric layer 222 on which a linear pattern 221 has been printed; a dielectric layer 224 on which a surface-shaped pattern 223 has been printed; a dielectric layer 227 on which a surface-shaped pattern 225 and a linear pattern 226 have been printed; and a dielectric layer 229 on which a linear pattern 228 has been printed. Further, in the substrate 22, the pattern 221 functions as the inductor 1121 (1321, 1521), the patterns 223, 225 which are opposed to each other with the dielectric layer 224 interposed therebetween function as the capacitor 1123 (1323, 1523), and the pattern 228 functions as the inductor 1122 (1322, 1522). Moreover, in the substrate 22, one end of the pattern 221 and one end of the pattern 228 are connected through a through hole penetrating the dielectric layers 222, 224, 227, one end of the pattern 226 is connected with the dielectric layer 225, the other end of the pattern 226 is grounded, and the other end of the pattern 228 is grounded, to form the LC element network 111, (131, 151). Needless to say, chip inductors which are mounted on the substrate 22 or wires for wire bonding may be the inductors 1121, 1122, 1321, 1322, 1521, 1522. Further, the chip capacitors mounted on the substrate 22 may be the capacitors 1123, 1323, 1523. As a material for the dielectric layers in the substrate 22, a low temperature co-fired ceramics (LTCC) with a dielectric constant in the vicinity of 7 or a resin with a dielectric constant in the vicinity of 4 can be preferably adopted.

(Structure of Bear Chip)

Figure 4:
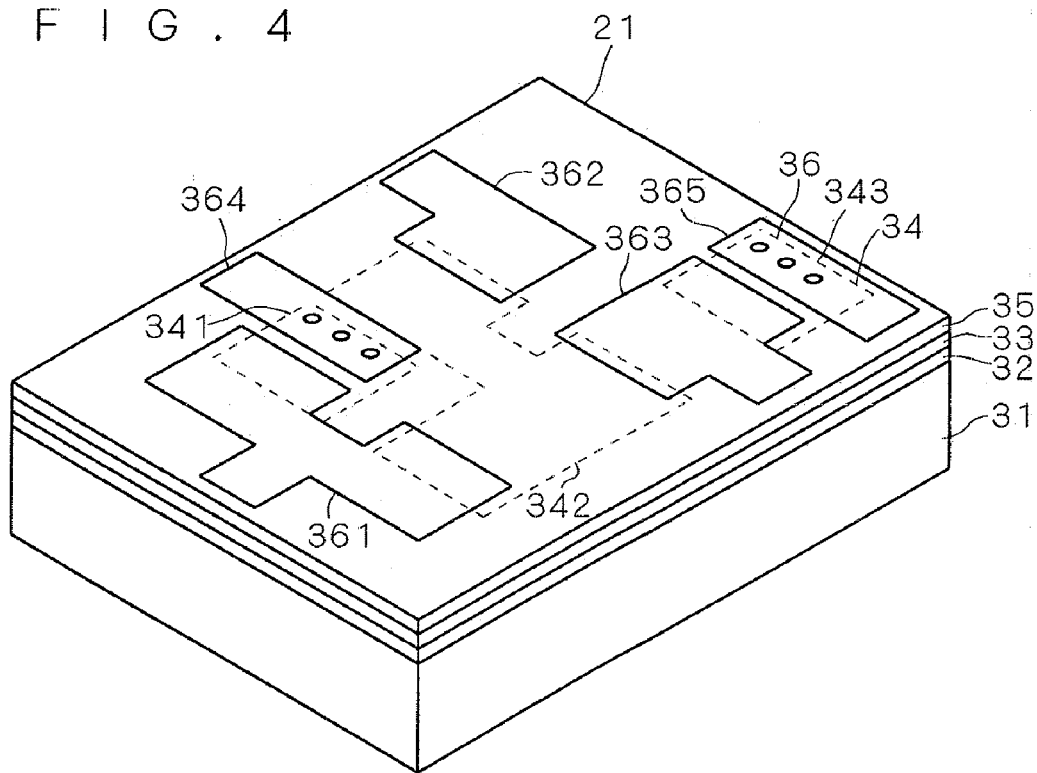
FIG. 4 is an oblique view of a bear chip.

FIG. 4 is an oblique view schematically showing a structure of the bear chip 21.

As shown in FIG. 4, the bear chip 21 has a configuration formed by laminating on a supporting substrate 31, an adhesive layer 32, a cavity formation layer 33, a lower surface electrode 34, a piezoelectric thin film 35, and an upper surface electrode 36 in this order.

The supporting substrate 31 serves as a supporting body for supporting the piezoelectric thin film 35. It is preferable that the supporting substrate 31 be constituted of the same material as a piezoelectric material constituting the piezoelectric thin film 35, and it is further preferable that a crystal orientation in the supporting substrate 31 match a crystal orientation in the piezoelectric thin film 35.

The adhesive layer 32 serves to adhesively fix the piezoelectric thin film 35 to the supporting substrate 31. Preferred examples of the adhesive layer 32 may include an epoxy adhesive (adhesive of an epoxy resin using thermosetting properties) and acrylic adhesive (adhesive of an acrylic resin using both photo-curing and thermosetting properties) which have filling effect and exert sufficient adhesive force even when an object to adhere is not completely flat.

The cavity formation layer 33 is an insulating film obtained by forming a film of an insulating material such as silica dioxide ($SiO_2$). In the cavity formation layer 33, a cavity is formed which separates from the supporting substrate 31 a vibration laminated body made up of the lower surface electrode 34, the piezoelectric thin film 35 and the upper surface electrode 36 in later-described excitation regions 311 to 315.

The piezoelectric element thin film 35 is obtained by performing removal processing on the piezoelectric substrate. More specifically, the piezoelectric thin film 35 is obtained by reducing, through removal processing, the thickness of the piezoelectric substrate, which is large enough to solely stand its own weight (e.g. not smaller than 50 μm) to the thickness not large enough to solely stand its own weight (e.g. not larger than 10 μm).

As an piezoelectric material constituting the piezoelectric thin film 35, a piezoelectric material having a desired piezoelectric characteristic can be selected, but it is preferable to select a monocrystal material not including a grain boundary, such as quarts ($SiO_2$), lithium niobate ($LiNbO_3$), lithium tantalite ($LiTaO_3$), lithium tetraborate ($Li_2B_4O_7$), zinc oxide (ZnO), potassium niobate ($KNbO_3$), or langasite ($La_3Ga_3SiO_{14}$). This is because the use of the monocrystal material as the piezoelectric material constituting the piezoelectric thin film 35 can lead to an improvement in electromechanical coupling coefficient as well as the mechanical quality factor.

Removal processing on the piezoelectric substrate is performed by mechanical processing such as cutting, grinding and polishing, and chemical processing such as etching. When a plurality of removal processing methods are combined and removal processing is performed on the piezoelectric substrate while the removal processing method is switched in stages from one with fast processing speed to one with a small processing alternation occurring in an object to be processed, it is then possible to improve the quality of the piezoelectric thin film 35 while maintaining high productivity, so as to improve a characteristic of the bear chip 21. For example, when the piezoelectric substrate is brought into contact with a fixed abrasive coating for grinding and polishing the piezoelectric substrate is also brought into contact with an isolated abrasive coating for polishing, and subsequently the processing alternation layer generated on the piezoelectric substrate by polishing is removed. Therefore, the grinding of the piezoelectric substrate is accelerated and productivity of the bear chip 21 is improved, while still improving the quality of the piezoelectric thin film 35 and the characteristics of the bear chip 21.

In such a bear chip 21, in contrast to a case of forming the piezoelectric thin film 35 by sputtering or the like, since the piezoelectric material constituting the piezoelectric thin film 35 and the crystal orientation in the piezoelectric thin film 35 are not restricted by the substrate, the flexibility is high in selection of the piezoelectric material constituting the piezoelectric thin film 35 and the crystal orientation in the piezoelectric thin film 35. Therefore, realizing a predetermined characteristic is easy in the bear chip 21. However, this does not prevent the use of the piezoelectric thin film resonator with the piezoelectric thin film 35 formed therein by added processing such as sputtering.

The lower surface electrode 34 and the upper surface electrode 36 are conductive thin films respectively obtained by forming conductive materials on the lower surface and the upper surface of the piezoelectric thin film 35.

The conductive material constituting the lower surface electrode 34 and the upper surface electrode 36 is not particularly restricted, but it is preferable to select the material from metals such as aluminum (Al), silver (Ag), copper (Cu), platinum (Pt), gold (Au), chrome (Cr), nickel (Ni), molybdenum (Mo), tungsten (W) and tantalum (Ta). Needless to say, an alloy may be used as the conductive material constituting the lower surface electrode 34 and the upper surface electrode 36. Further, a plurality of kinds of conductive materials may be superposed to form the lower surface electrode 34 and the upper surface electrode 36.

Figure 5:
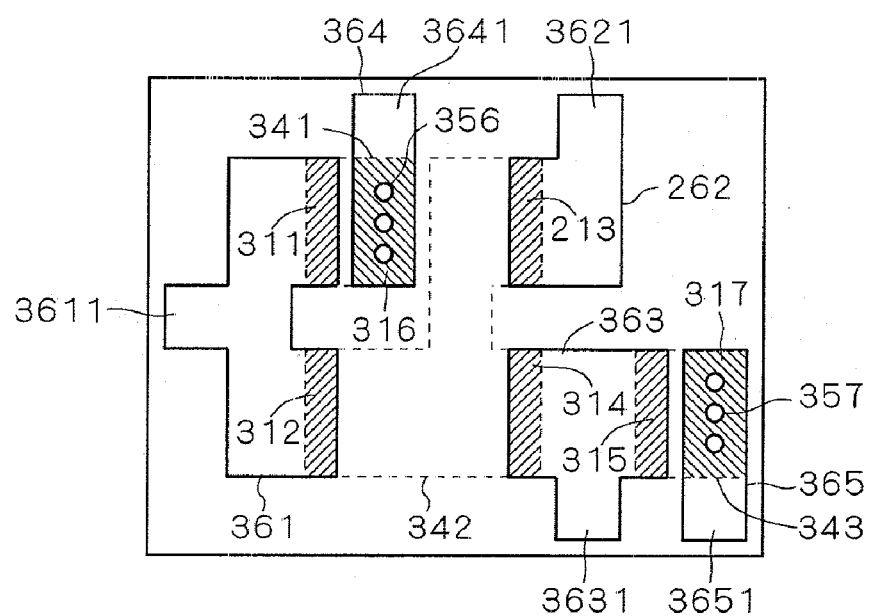
FIG. 5 is a view showing patterns of an upper surface electrode and a lower surface electrode.

FIG. 5 is a view of patterns of the lower surface electrode 34 (341 to 343) and the upper surface electrode 36 (361 to 365) seen from above.

The upper electrode 361 forms a parallel resonator 111 by being opposed to the lower electrode 341 with the piezoelectric thin film 35 interposed therebetween in an excitation region 311, and also forms a series resonator 121 by being opposed to the lower electrode 342 with the piezoelectric thin film 35 interposed therebetween in an excitation region 312. A part 3611 of the upper electrode 361 is connected to a first port by flip-chip connection.

The upper electrode 362 forms a parallel resonator 131 by being opposed to the lower electrode 342 with the piezoelectric thin film 35 interposed therebetween in an excitation region 313. A part 3621 of the upper electrode 362 is connected to the LC element network 132 by flip-chip connection.

The upper electrode 363 forms a series resonator 141 by being opposed to the lower electrode 342 with the piezoelectric thin film 35 interposed therebetween in an excitation region 314, and also forms a series resonator 151 by being opposed to the lower electrode 343 with the piezoelectric thin film 35 interposed therebetween in an excitation region 315.

A part 3631 of the upper electrode 363 is connected to a second port by flip-chip connection.

The upper electrode 364 is opposed to the lower electrode 341 with the piezoelectric thin film 35 interposed therebetween in a non-excitation region 316. The lower electrode 341 and the upper electrode 364 are short-circuited by a via hole 356. A part 3641 of the upper electrode 364 is connected to the LC element network 112 by a flip-chip connection.

The upper electrode 365 is opposed to the lower electrode 343 with the piezoelectric thin film 35 interposed therebetween in a non-excitation region 317. The lower electrode 343 and the upper electrode 365 are short-circuited by a via hole 357. A part 3651 of the upper electrode 365 is connected to the LC element network 152 by a flip-chip connection.

EXAMPLES

In the following, an example of the present invention and comparative examples outside the scope of the present invention are described.

Example

Figure 6:
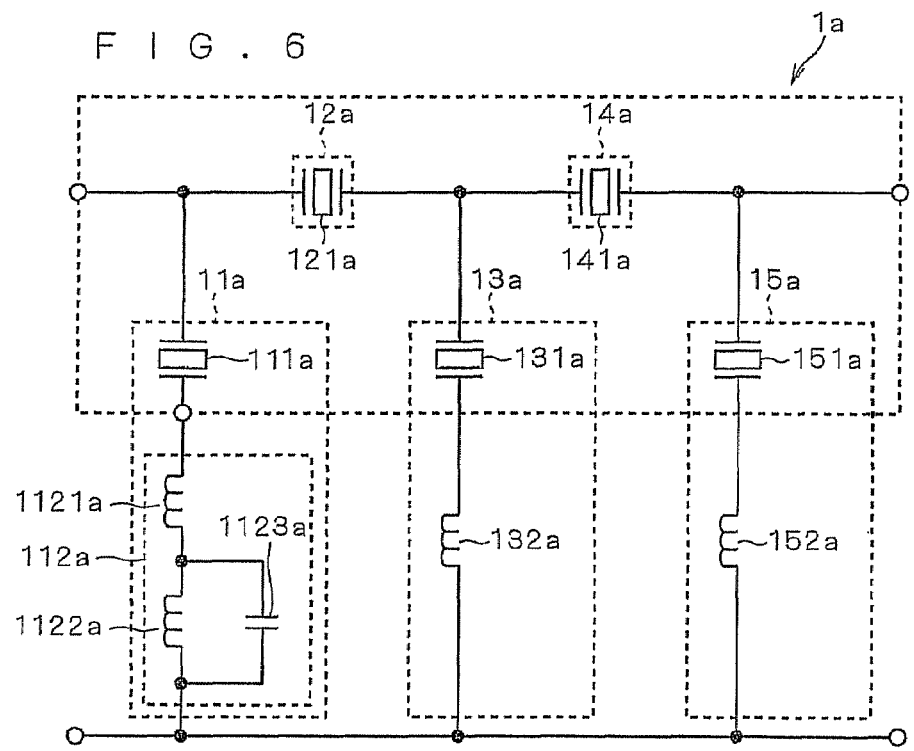
FIG. 6 is a circuit view of a ladder-type piezoelectric filter of Example.

In the Example, the bear chip 21 using lithium niobate was used as the piezoelectric thin film 35, to produce a ladder-type piezoelectric filter 1a shown in a circuit diagram of FIG. 6, and a filtering characteristic of the filter was measured by a network analyzer. FIGS. 7 and 8 show measurement results of a voltage reflection coefficient $S_{11}$ and a voltage transmission coefficient $S_{21}$. In the ladder-type piezoelectric filter 1a, a parallel arm 11a is made up by serially connecting a parallel resonator 111a and an LC element network 112a, the parallel arms 13a, 15a are respectively made up by serially connecting the parallel resonators 131a, 151a and inductors 132a, 152a, while series arms 12a, 14a are respectively made up of series resonators 121a, 141a. Inductances of the inductors 1121a, 1122a, 132a, 152a are respectively 0.8 nH, 0.7 nH, 1.0 nH and 2.9 nH, and a capacitance of a capacitor 1123a is 2.35 pF. Thereby, the ladder-type piezoelectric filter 1a comes to have three attenuation poles (the vicinity of 1.80 GHz, the vicinity 1.98 GHz, the vicinity of 2.05 GHz) within the stop band on the low frequency side, and five attenuation poles (the vicinity of 2.25 GHz, the vicinity of 2.35 GHz, the vicinity of 2.60 GHz, the vicinity of 4.1 GHz, the vicinity of 6.2 GHz) within the stop band on the high frequency side.

Comparative Example 1

Figure 9:
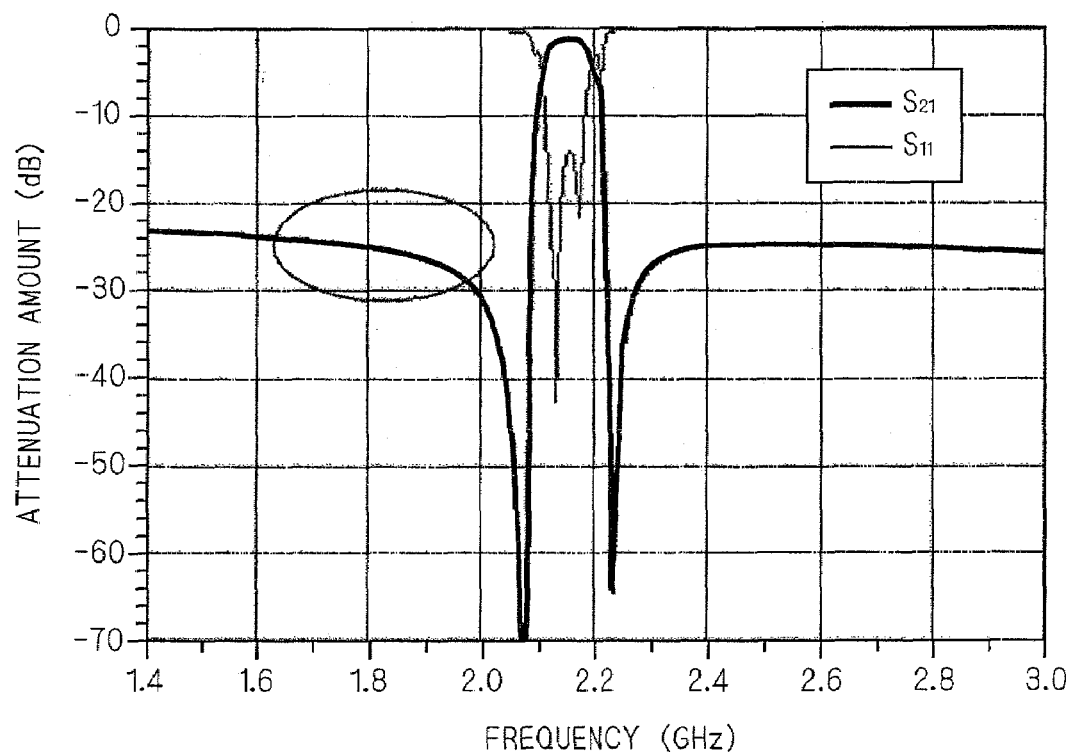
FIGS. 9 and 10 are views each showing a filtering characteristic of a ladder-type piezoelectric filter of Comparative Example 1.
Figure 10:
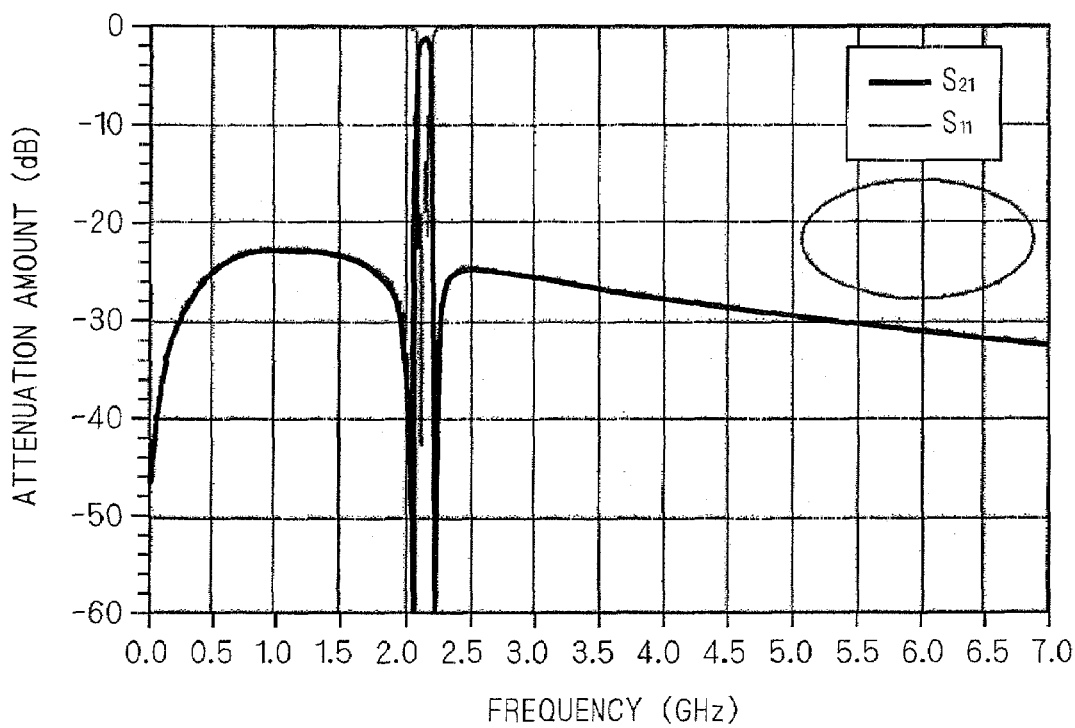
Figure 13:
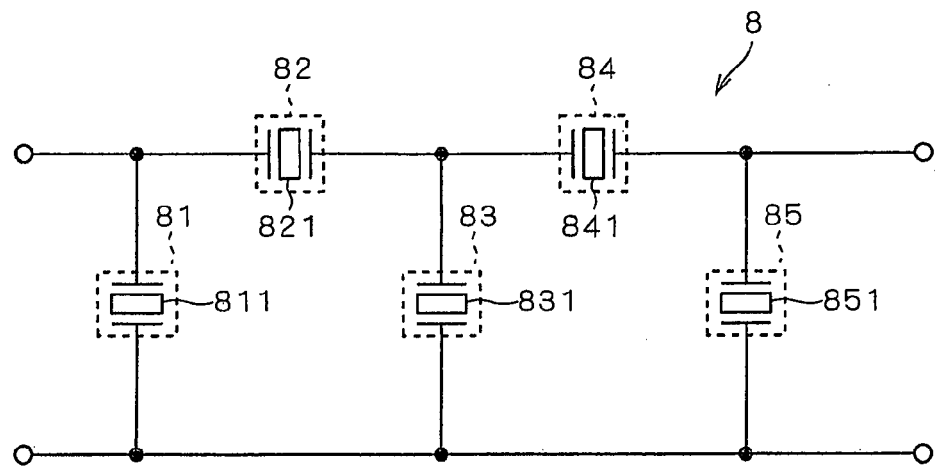
FIGS. 13 and 14 are views of conventional ladder-type piezoelectric filters.

In Comparative Example 1, the same bear chip 21 as in the Example was used to produce a ladder-type piezoelectric filter 8 shown in a circuit diagram of FIG. 13, and a filtering characteristic thereof was measured by the network analyzer. FIGS. 9 and 10 show measurement results of the voltage reflection coefficient $S_{11}$ and the voltage transmission coefficient $S_{21}$.

Comparative Example 2

Figure 14:
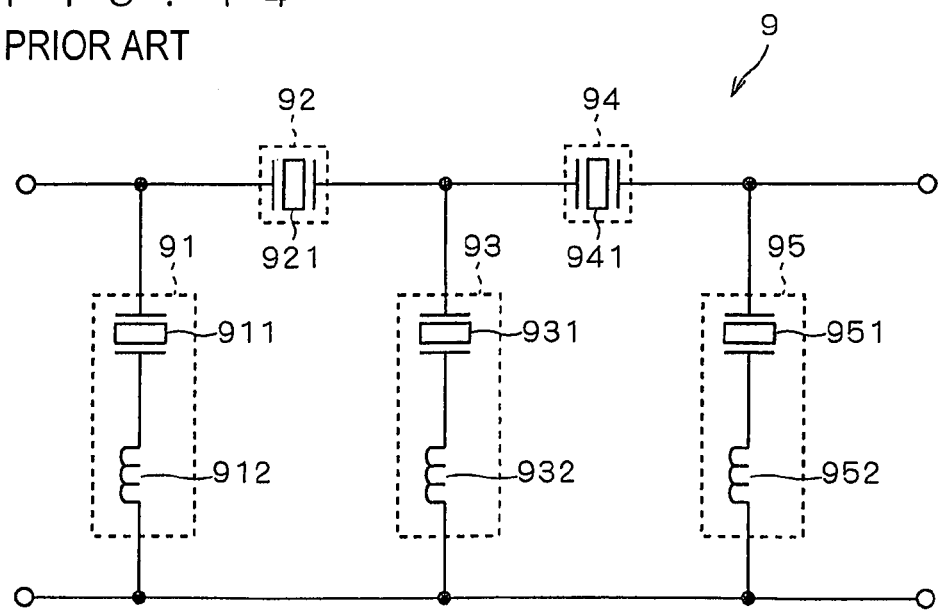

In Comparative Example 2, the same bear chip 21 as in Example was used, to produce a ladder-type piezoelectric filter 9 shown in a circuit diagram of FIG. 14, and a filtering characteristic of the filter was measured by the network analyzer. FIGS. 11 and 12 show measurement results of the voltage reflection coefficient $S_{11}$ and the voltage transmission coefficient $S_{21}$. In Comparative Example 2, inductances of inductors 912, 932, 952 are respectively 1.5 nH, 1.0 nH, and 2.9 nH.

(Comparison between Example and Comparative Examples)

As apparent from the comparison between the Example and Comparative Examples, the ladder-type piezoelectric filter 1a of the Example had a wider pass band width than that of the ladder-type piezoelectric filter 8 of Comparative Example 1, indicative of success in increasing attenuation in the stop band on the low frequency side more than the ladder-type piezoelectric filter 8. Further, the ladder-type piezoelectric filter 1a of Example formed a new attenuation pole in the vicinity of 6.2 GHz, indicative of success in increasing attenuation in the stop band on the high frequency side more than the ladder-type piezoelectric filter 9 of Comparative Example 2.

While the invention has been shown and described in detail, the foregoing description is in all aspects illustrative and not restrictive. It is therefore understood that numerous modifications and variations can be devised without departing from the scope of the invention.

What is claimed is:

1. A ladder-type piezoelectric filter comprising:
   parallel arms which include parallel resonators; and
   series arms which include series resonators, wherein
   in all or part of said parallel arms, an element network including a capacitive element which is inductive in a resonant frequency of said parallel resonator and contributes to formation of a new series resonant point in a stop band on a high frequency side, is serially connected to said parallel resonator.

2. The ladder-type piezoelectric filter according to claim 1, wherein said element network is made up by combining an inductor and a capacitor.

3. The ladder-type piezoelectric filter according to claim 1, comprising a plurality of said element networks with different series resonant points which are newly formed by a contribution of said capacitor.

* * * * *